United States Patent
Li (10) Patent No.: US 11,140,250 B2
(45) Date of Patent: Oct. 5, 2021

(54) DISPLAY CONTROL METHOD, DEVICE AND ELECTRONIC APPARATUS

(71) Applicant: BEIJING XIAOMI MOBILE SOFTWARE CO., LTD., Beijing (CN)

(72) Inventor: Jinze Li, Beijing (CN)

(73) Assignee: BEIJING XIAOMI MOBILE SOFTWARE CO., LTD., Beijing (CN)

(*) Notice: Subject to any disclaimer, the term of this patent is extended or adjusted under 35 U.S.C. 154(b) by 0 days.

(21) Appl. No.: 16/813,684

(22) Filed: Mar. 9, 2020

(65) Prior Publication Data

US 2021/0120112 A1 Apr. 22, 2021

(30) Foreign Application Priority Data

Oct. 17, 2019 (CN) .......................... 201910987969.5

(51) Int. Cl.
*H04M 1/02* (2006.01)
*G02F 1/1333* (2006.01)
*G02F 1/13357* (2006.01)
*H01L 27/32* (2006.01)
*H04N 5/232* (2006.01)
*G09G 3/20* (2006.01)

(52) U.S. Cl.
CPC ...... *H04M 1/0264* (2013.01); *G02F 1/13338* (2013.01); *G02F 1/133602* (2013.01);
(Continued)

(58) Field of Classification Search
CPC ............ H04M 1/0264; G02F 1/133602; G02F 1/13338; H01L 27/323; H01L 27/3234; H04N 5/232
(Continued)

(56) References Cited

U.S. PATENT DOCUMENTS

2007/0002130 A1* 1/2007 Hartkop ................ H04N 7/141
348/14.16
2008/0309811 A1* 12/2008 Fujinawa ......... H04N 5/232945
348/333.01
(Continued)

FOREIGN PATENT DOCUMENTS

CN 106936958 A 7/2017
CN 109495622 A 3/2019
(Continued)

OTHER PUBLICATIONS

Extended European Search Report in Application No. 20166577, dated Aug. 26, 2020.

*Primary Examiner* — Chineyere D Wills-Burns
(74) *Attorney, Agent, or Firm* — Syncoda LLC; Feng Ma (57) ABSTRACT

An electronic apparatus includes: a display panel having an opening, a first display area surrounding at least a portion of the opening, and a second display area different from the first display area; and a camera module disposed corresponding to the opening to obtain light through the opening. A display control method for the electronic apparatus includes: obtaining an ON/OFF state of the camera module; and adjusting a working state of the first display area in accordance with the ON/OFF state of the camera module, wherein the first display area is adjusted to a first state so as to shield at least a portion of light from entering the opening when the camera module is in ON state, and the first display area is adjusted to a second state when the camera module is in OFF state.

18 Claims, 6 Drawing Sheets

(52) U.S. Cl.
CPC ........ *H01L 27/323* (2013.01); *H01L 27/3234* (2013.01); *H04N 5/232* (2013.01)

(58) Field of Classification Search
USPC .......................................................... 345/156
See application file for complete search history.

(56) References Cited

U.S. PATENT DOCUMENTS

| | | | |
|---|---|---|---|
| 2009/0184918 A1* | 7/2009 | Feng .................... | G09G 3/3426 345/102 |
| 2016/0189619 A1* | 6/2016 | Park ....................... | G09G 3/007 345/690 |
| 2016/0217750 A1* | 7/2016 | Lee ......................... | G02F 1/133 |
| 2017/0084231 A1* | 3/2017 | Chew ..................... | G06F 1/1686 |
| 2017/0171448 A1* | 6/2017 | Evans, V ............... | G06F 1/1637 |
| 2018/0013944 A1* | 1/2018 | Evans, V ............. | G02F 1/13318 |
| 2019/0369422 A1* | 12/2019 | Zeng ..................... | G06F 1/3215 |
| 2019/0384121 A1* | 12/2019 | Nishiwaki ......... | G02F 1/133512 |
| 2020/0106936 A1* | 4/2020 | Yu ......................... | G06F 1/1605 |
| 2020/0225522 A1* | 7/2020 | Gao ..................... | G06F 1/1686 |

FOREIGN PATENT DOCUMENTS

| | | |
|---|---|---|
| EP | 3576158 A1 | 12/2019 |
| EP | 3629560 A1 | 4/2020 |
| EP | 3683651 A1 | 7/2020 |
| WO | 2019154072 A1 | 8/2019 |

* cited by examiner

DISPLAY CONTROL METHOD, DEVICE AND ELECTRONIC APPARATUS

CROSS-REFERENCE TO RELATED APPLICATION

This application claims priority to Chinese Patent Application No. 201910987969.5 filed on Oct. 17, 2019, the disclosure of which is hereby incorporated by reference in its entirety.

BACKGROUND

To satisfy the demands of the users for super-large display area while ensuring selfie function of an electronic apparatus, a display screen can be provided with an opening in a "water droplet" shape, through which light is allowed to pass. Such an opening can be configured in a display panel of the electronic apparatus, to ensure that a camera module can obtain light while a non-display area at top of the electronic apparatus is decreased and thereby a display area thereof is increased.

SUMMARY

The present disclosure relates generally to the field of terminals, and more specifically to a display control method, device and electronic apparatus.

According to a first aspect of the embodiments of the present disclosure, there is provided a display control method, which is applicable to an electronic apparatus including:

a display panel, including an opening, a first display area surrounding at least a portion of the opening and a second display area different from the first display area; and a camera module disposed corresponding to the opening to obtain light through the opening;

the display control method includes:

obtaining an ON/OFF state of the camera module; and adjusting a working state of the first display area in accordance with the ON/OFF state of the camera module, wherein the first display area is adjusted to a first state so as to shield at least a portion of light from entering the opening when the camera module is in ON state, and the first display area is adjusted to a second state when the camera module is in OFF state.

Alternatively, the display panel includes a liquid crystal display panel, and the adjusting the first display area to the first state includes:

adjusting deflection angles of liquid crystal molecules corresponding to the first display area in the liquid crystal display panel to shield light emitted from a backlight sheet in the liquid crystal display panel such that the first display area displays black.

Alternatively, the display panel includes a self-luminous display panel, and the adjusting the first display area to the first state includes:

adjusting film transistor units corresponding to the first display area in the self-luminous display panel to an OFF state such that the first display area is switched to a non-display state.

Alternatively, the adjusting the first display area to the second state when the camera module is in the OFF state includes:

adjusting the first display area to a display state when the camera module is in the OFF state.

Alternatively, the obtaining the ON/OFF state of the camera module includes:

detecting a preset trigger operation for triggering the camera module and adjusting the ON/OFF state of the camera module; and determining the ON/OFF state of the camera module in accordance with the preset trigger operation.

Alternatively, the first display area is determined by following steps:

obtaining a plurality groups of data of an amount of light entering the opening, each group of which is corresponding to a different size of the first display area; and determining the size of the first display area in accordance with the plurality groups of data of the amount of light and a light leak threshold of the camera module.

According to a second aspect of the embodiments of the present disclosure, there is provided a display control device, which is applicable to an electronic apparatus including:

a display panel, including an opening, a first display area surrounding at least a portion of the opening and a second display area different from the first display area; and a camera module disposed corresponding to the opening to obtain light through the opening;

the display control device includes:

an obtaining module configured to obtain an ON/OFF state of the camera module; and an adjusting module configured to adjust a working state of the first display area in accordance with the ON/OFF state of the camera module, wherein the first display area is adjusted to a first state to shield at least a portion of light from entering the opening when the camera module is in ON state, and the first display area is adjusted to a second state when the camera module is in OFF state.

Alternatively, the display panel includes a liquid crystal display panel, and the adjusting module includes:

a first adjusting unit configured to adjust deflection angles of liquid crystal molecules corresponding to the first display area in the liquid crystal display panel to shield light emitted from a backlight sheet in the liquid crystal display panel such that the first display area displays black.

Alternatively, the display panel includes a self-luminous display panel, and the adjusting module includes:

a second adjusting unit configured to adjust a film transistor unit corresponding to the first display area in the self-luminous display panel to an OFF state such that the first display area is switched to a non-display state.

Alternatively, the adjusting module includes:

a third adjusting unit configured to adjust the first display area to a display state when the camera module is in the OFF state.

Alternatively, the obtaining module includes:

a detecting unit configured to detect a preset trigger operation for triggering the camera module and adjusting the ON/OFF state of the camera module and to determine the ON/OFF state of the camera module in accordance with the preset trigger operation.

Alternatively, the first display area is determined by following steps:

obtaining a plurality groups of data of an amount of light entering the opening, each group of which is corresponding to a different size of the first display area; and determining the size of the first display area in accordance with a plurality groups of data of the amount of light and a light leak threshold of the camera module.

According to a third aspect of the embodiments of the present disclosure, there is provided a computer-readable memory medium having stored therein instructions, when executed by a processor, implementing steps of the method as described in any one of the above embodiments.

According to a fourth aspect of the embodiments of the present disclosure, there is provided an electronic apparatus including:

a processor; and a memory configured to store instructions executable by the processor;

wherein the processor is configured to execute and implement steps of the method as described in any one of the above embodiments.

It should be understood that the above general description and the following detailed description are exemplary and explanatory, and are not intended to limit the present disclosure.

BRIEF DESCRIPTION OF THE DRAWINGS

The accompanying drawings, which are incorporated in and constitute a portion of this disclosure, illustrate embodiments consistent with the disclosure and, together with the disclosure, serve to explain the principles of the disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of devices and methods consistent with aspects related to the disclosure as recited in the appended claims.

Terms used in this application are only for the purpose of describing specific embodiments instead of limiting this application. The singular forms "a/an," "the" and "said" used in this application and the attached claims are intended to include the plural forms, unless the context clearly indicates otherwise. It should be understood that terms "and/or" used herein refers to and comprises any or all possible combinations of one or more of the associated listed items.

It should be understood that, although this application is possible to take the terms "first," "second" and "third," etc. may be used in the application to describe various information, the information should not be limited by these terms. These terms are only used to distinguish same type of information from each other. For example, without departing from the scope of this application, a first information may be referred to as a second information. Similarly, the second information may be referred to as the first information. Based on the context, for example, a word "if" used herein may be explained as "while/as" or "when" or "in response to determining".

Figure 1:
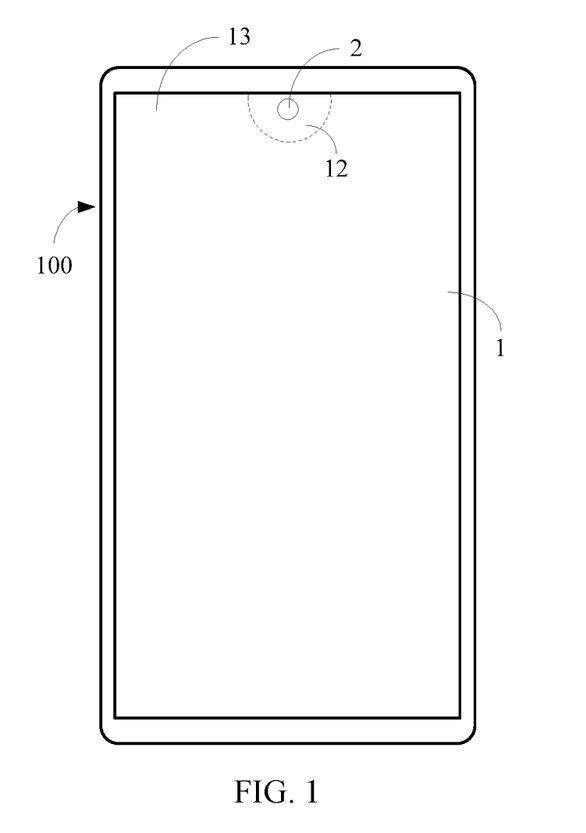
FIG. 1 is a schematic diagram illustrating the structure of an electronic apparatus in accordance with an exemplary embodiment.
Figure 2:
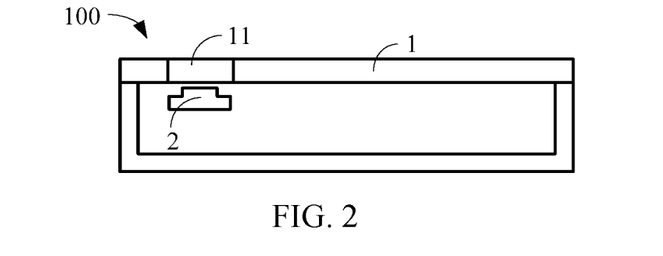
FIG. 2 is a sectional view illustrating an electronic apparatus in accordance with an exemplary embodiment.

FIG. 1 is a schematic diagram illustrating the structure of an electronic apparatus 100 in accordance with an exemplary embodiment. FIG. 2 is a sectional view illustrating an electronic apparatus 100 in accordance with an exemplary embodiment. As shown in FIGS. 1 and 2, the electronic apparatus 100 may comprise a display panel 1 and a camera module 2, wherein the display panel 1 may comprise an opening 11, a first display area 12 surrounding at least a portion of the opening 11 and a second display area 13 different from the first display area 12 and connected with the first display area 12, and the camera module 2 is disposed corresponding to the opening 11 so as to obtain outer light through the opening 11 to conduct imaging. Since the opening 11 is located in the vicinity of the first display area 12, image distortion might occur because light emitted from the first display area 12 may enter the opening 11 to affect the imaging effect of the camera module 2 after possibly being refracted or reflected for many times, when the first display area 12 is in a display state and the camera module 1 is required to conduct imaging. Herein, the opening 11 may comprise blind hole or through hole, which is not limited thereto in the present disclosure.

Figure 3:
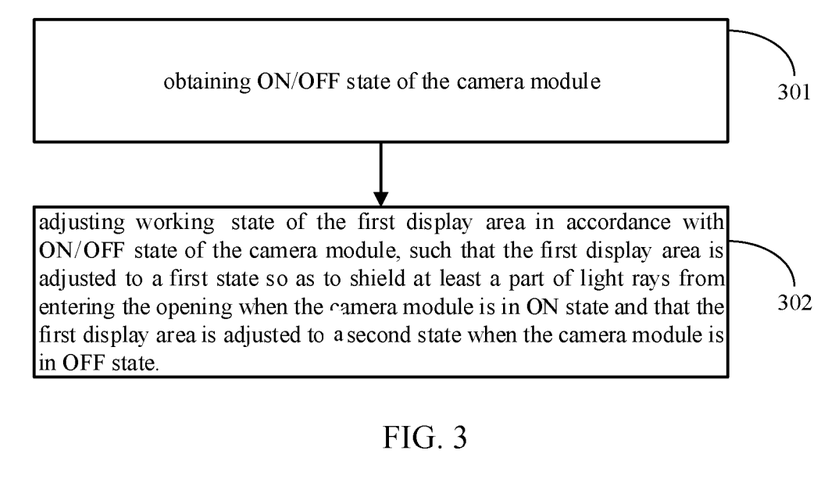
FIG. 3 is a flowchart illustrating a display control method in accordance with an exemplary embodiment.

Accordingly, the present disclosure provides a display control method applied to the electronic apparatus 100 as shown in FIGS. 1 and 2. Specifically, as shown in FIG. 3, the display control method may include the following steps.

Step 301 of obtaining the ON/OFF state of the camera module 2.

In this embodiment, the ON/OFF state of the camera module 2 may comprise an ON state and an OFF state. When the camera module 2 is switched to the ON state, the camera module 2 may obtain outer light through the opening 11 to conduct imaging. The ON/OFF state of the camera module 2 may be obtained by detecting a preset trigger operation of the camera module 2 which may be used for adjusting a working state of the camera module 2 and the first display area 12 subsequently. For example, when users trigger "camera" shown in the electronic apparatus 100, the electronic apparatus 100 may detect the preset trigger operation. Or, when users trigger fast operation of physical key such as "home" key plus "volume" key, electronic apparatus 100 may detect the preset trigger operation. Definitely, the preset trigger operation may also be in other forms, for which no further examples are listed one by one herein.

Step 302 of adjusting a working state of the first display area 12 in accordance with the ON/OFF state of the camera module 2, includes adjusting the first display area 12 to a first state so as to shield at least a portion of light from entering the opening 11 when the camera module 2 is in the ON state, and adjusting the first display area 12 to a second state when the camera module 2 is in the OFF state.

Herein, the first state, used for representing a state of avoiding light from entering the opening 11 or a state of weakening light entering the opening 11, may be non-display state or a state that luminous flux transmitting the screen at the first display area 12 is lower than a preset threshold (for example, a state of black screen).

Herein, the second state may be a display state or a non-display state. When the first display area 12 is in the display state, the first and second display areas 12, 13 may be controlled synchronously to display.

In this embodiment, preferably, when the camera module 2 is in the ON state, the first display area 12 is switched to the first state to shield at least a portion of light from entering the opening 11 and decrease amount of light leaking into the opening 11 from the display panel 1; and the first display area 12 is switched to the second state to realize a normal display when the camera module 2 is in the OFF state.

When different types of the display panel 1 are employed, the first states thereof are different accordingly. In an embodiment, the display panel 1 may comprise a liquid crystal display panel, and then, when the camera module 2 is switched to the ON state, deflection angle of liquid crystal molecule corresponding to the first display area 12 in the liquid crystal display panel may be adjusted such that light emitted from a backlight sheet in the liquid crystal display panel cannot transmit, and thereby the first display area 12 displays black, namely, shielding light.

In another embodiment, the display panel 1 may comprise self-luminous display panel, and then, when the camera module 2 is switched to the ON state, a film transistor unit corresponding to the first display area 12 in the liquid crystal display panel may be adjusted to the OFF state such that the first display area 12 is in a non-display state, no longer generating light and playing a role of shielding light of the second display area 13.

In above various embodiments, no matter the liquid crystal display panel or the self-luminous display panel, when the camera module 2 is switched to the OFF state, the first display area 12 is switched to the display state to enable the display panel 1 to emit light normally, thereby increasing the display area.

Further, in respect of the first display area 12 stated in above various embodiments, the present disclosure also provides following steps to determine the size of the first display area 12. Specifically speaking, the steps may include: obtaining a plurality groups of data of amount of light entering the opening 11, each group of which may be corresponding to a different size of the first display area 12; and the size of the first display area 12 may be determined in accordance with a plurality groups of data of amount of light and the light leak threshold of the camera module 2. Herein, the light leak threshold is the largest amount of interferential light permitted by the camera module 2, that is, the amount of the interferential light corresponding to the greatest distortion effect of image obtained by the camera module 2, is the light leak threshold of the camera module 2.

It can be known from the above embodiments of the present disclosure that the working state of the first display area 12 may be adjusted in accordance with the ON/OFF state of the camera module 2, so as to decrease the amount of light emitted from the display panel 1 and entering the opening 11 when the camera module 2 is in the ON state, thereby reducing the influence of light emitted from the display panel 1 on the image capturing effect of the camera module 2 and improving the image capturing effect.

For detailed description of the present disclosure, solutions will be set forth hereinafter in accordance with a specific embodiment.

Figure 4:
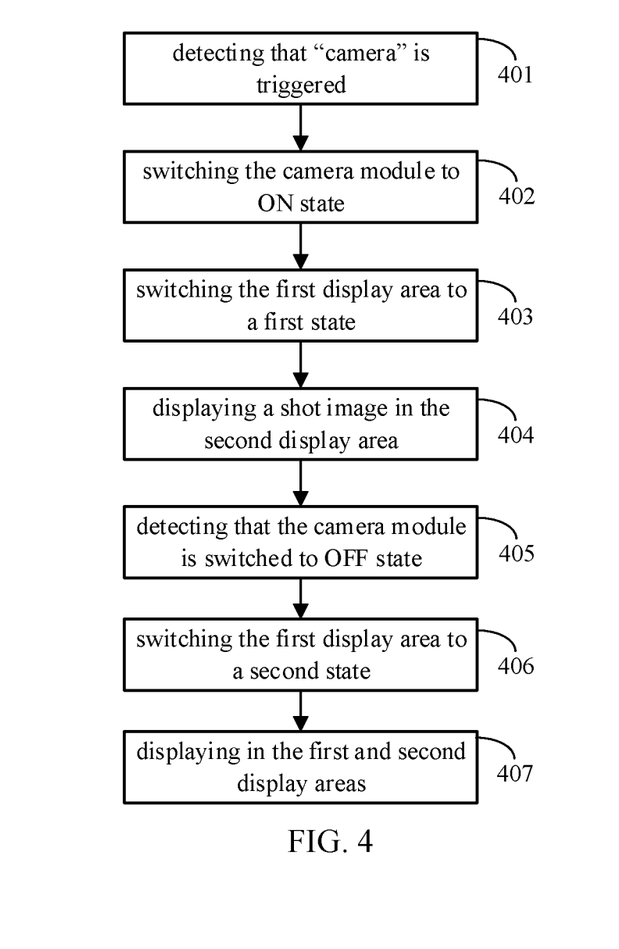
FIG. 4 is a flowchart illustrating another display control method in accordance with an exemplary embodiment.

As shown in FIG. 4, the display control method may include the following steps.

Step 401 of detecting that the "camera" in the display panel 1 is triggered.

Step 402 of switching the camera module 2 to the ON state.

Step 403 of switching the first display area 12 to the first state.

Figure 5:
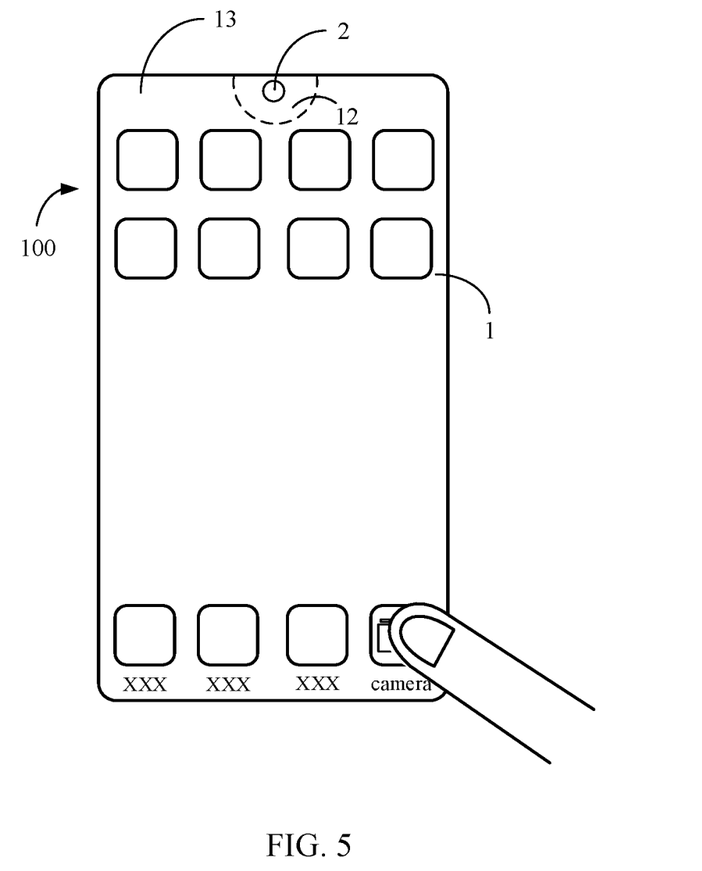
FIG. 5 is a view illustrating a display state of an electronic apparatus in accordance with an exemplary embodiment.
Figure 6:
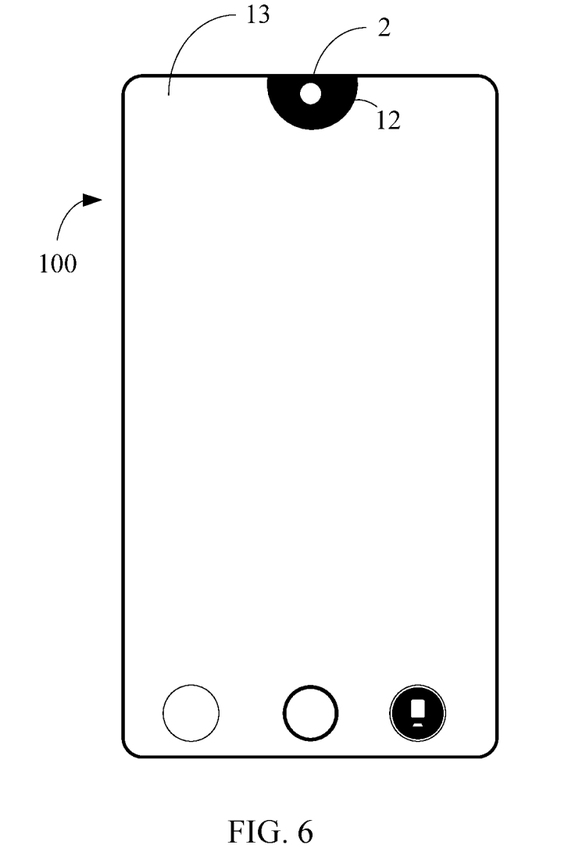
FIG. 6 is a view illustrating another display state of an electronic apparatus in accordance with an exemplary embodiment.

In this embodiment, as shown in FIG. 5, when desktop is displayed in the electronic apparatus 100 and users trigger "camera," electronic apparatus 100 may detect the trigger operation and switch the camera module 2 to the ON state, and then electronic apparatus 100 is switched to display a image capturing interface as shown in FIG. 6. At this moment, the first display area 12 may be switched to the first state to shield partial light from entering the opening 11 so as to improve image capturing effect of the camera module 2; and the second display area 13 may be used for displaying an image captured by the camera module 2.

Step 404 of displaying the captured image obtained by the camera module 2 in the second display area 13.

Step 405 of detecting that the camera module 2 is switched to the OFF state.

Step 406 of switching the first display area 12 to the second state.

In this embodiment, when detecting that the camera module 2 is switched to the OFF state, the first display area 12 may be switched to the second state to enable the first display area 12 to display colorful frames. Herein, when users execute the trigger operation to enable the electronic apparatus 100 to exit the image capturing interface, it may be considered as detecting that the camera module 2 is switched to the OFF state; or when detecting that the key of locking screen is pressed, it may be considered as detecting that the camera module 2 is switched to the OFF state. Definitely, users may also close the camera module 2 by other operations, for which no further examples are listed one by one herein.

Step 407 of the first display area 12 and the second display area 13 displaying image information together.

In this embodiment, when the camera module 2 is in the OFF state, the first display area 12 may cooperate with the second display area 13 to display the frames so as to increase the display area of the electronic apparatus 100 as much as possible. It should be noted that the first and second display areas 12 and 13 may be synchronously switched to the display state or the non-display state when the camera module 2 is in the OFF state.

Corresponding to the above embodiments of the display control method, the present disclosure also provides the embodiments of a display control device.

Figure 7:
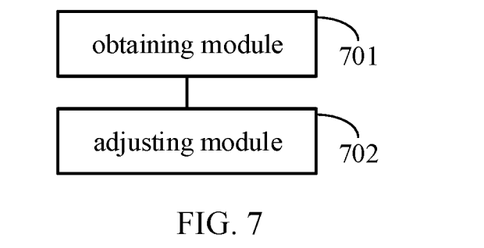
FIG. 7 is a block diagram illustrating a display control device in accordance with a first exemplary embodiment.

FIG. 7 is a block diagram illustrating a display control device in accordance with a first exemplary embodiment. The display control device, which is applied to the electronic apparatus, comprises: the display panel comprising an opening, a first display area surrounding at least a portion of the opening and a second display area different from the first display area; and a camera module disposed corresponding to the opening so as to obtain light through the opening. Referring to FIG. 7, the display control device comprises an obtaining module 701 and an adjusting module 702, wherein:

an obtaining module 701 configured to obtain an ON/OFF state of the camera module; and an adjusting module 702 configured to adjust a working state of the first display area in accordance with the ON/OFF state of the camera module, wherein the first display area is adjusted to a first state so as to shield at least a portion of light from entering the opening when the camera module is in ON state, and the first display area is adjusted to a second state when the camera module is in OFF state.

Figure 8:
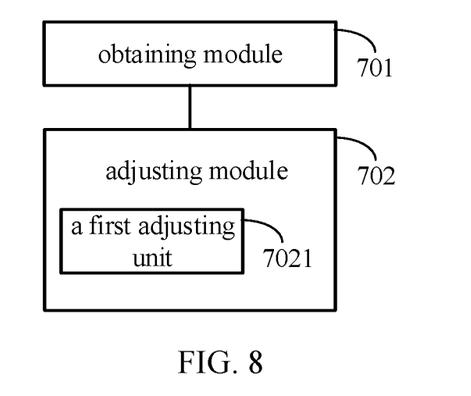
FIG. 8 is a block diagram illustrating another display control device in accordance with a second exemplary embodiment.

Alternatively, FIG. 8 is a block diagram illustrating another display control device in accordance with a second exemplary embodiment. On the basis of the above embodiment as shown in FIG. 7, the adjusting module 702 in the embodiment may comprise a first adjusting unit 7021.

The first adjusting unit 7021 is configured to adjust deflection angles of liquid crystal molecules corresponding to the first display area in the liquid crystal display panel to shield light emitted from a backlight sheet in the liquid crystal display panel such that the first display area displays black.

Figure 9:
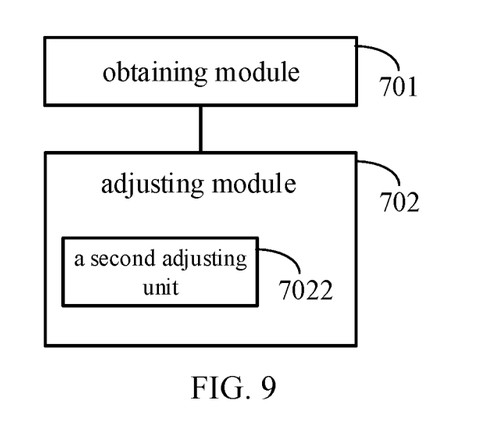
FIG. 9 is a block diagram illustrating a further display control device in accordance with a third exemplary embodiment.

Alternatively, FIG. 9 is a block diagram illustrating a display control device in accordance with a third exemplary embodiment. On the basis of the above embodiment as shown in FIG. 7, the adjusting module 702 in the embodiment may comprises second adjusting unit 7022.

The second adjusting unit 7022 is configured to adjust a film transistor unit corresponding to the first display area in the self-luminous display panel to an OFF state such that the first display area is switched to a non-display state.

Figure 10:
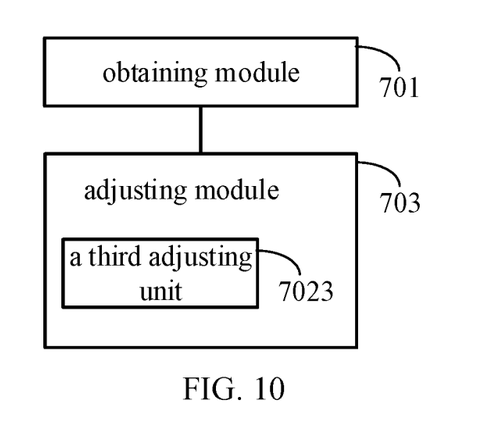
FIG. 10 is a block diagram illustrating a further display control device in accordance with a fourth exemplary embodiment.

Alternatively, FIG. 10 is a block diagram illustrating a display control device in accordance with a fourth exemplary embodiment. On the basis of embodiment as shown in FIG. 7, the adjusting module 702 in the embodiment may comprise a third adjusting unit 7023.

The third adjusting unit 7023 is configured to adjust the first display area to a display state when the camera module is in the OFF state.

It should be noted that the structure of the third adjusting unit 7023 in the above embodiment of the device shown in FIG. 10 may be also included in the above embodiment of the device in FIG. 8 or FIG. 9, which is not limited thereto in this disclosure.

Figure 11:
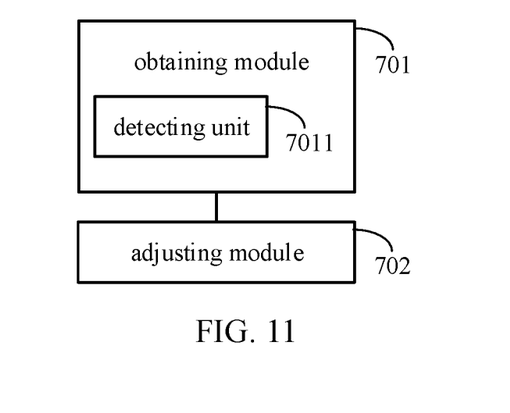
FIG. 11 is a block diagram illustrating a further display control device in accordance with a fifth exemplary embodiment.

Alternatively, FIG. 11 is a block diagram illustrating a display control device in accordance with a fifth exemplary embodiment. On the basis of above embodiment shown in FIG. 7, the obtaining module 701 comprises:

a detecting unit 7011 configured to detect a preset trigger operation for triggering the camera module and adjusting a working state of the camera module and the first display area.

It should be noted that the structure of the detecting unit 7011 in the above embodiment of the device shown in FIG. 11 may be also included in the above embodiment of the device in FIG. 8 or FIG. 9, which is not limited thereto in this disclosure.

Alternatively, the first display area is determined by following steps:

obtaining a plurality groups of data of an amount of light entering the opening, each group of which is corresponding to a different size of the first display area; and determining the size of the first display area in accordance with a plurality groups of data of the amount of light and a light leak threshold of the camera module.

In respect of the device in above embodiments, the detailed operation modes of each module have been specified in the embodiments relating to the method, and the detailed description thereof is omitted herein.

For the embodiments of the device, since it is basically corresponding to embodiments of the method, it may refer to the related parts of the embodiments of the method. Embodiments of the device described above is only illustrative, so the units thereof illustrated as separated parts may be or may not be separated physically, and the parts shown as a unit may be or may not be physical unit, i.e. these parts may be located in a place or may be distributed to multiple network units. Partial or full module thereof may be chosen in accordance with the actual need to realize the aim of the present disclosure. The skills in the art can understand and implement the present disclosure without inventive labor.

Accordingly, the present disclosure also provides a display control device applied to the electronic apparatus comprising: a display panel comprising an opening, a first display area surrounding at least a portion of the opening and a second display area different from the first display area; and a camera module disposed corresponding to the opening to obtain light through the opening; the display control device comprises a processor and a memory for storing instructions executable by the processor; wherein the processor is configured to obtain an ON/OFF state of the camera module and to adjust a working state of the first display area in accordance with the ON/OFF state of the camera module, wherein the first display area is adjusted to a first state so as to shield at least a portion of light from entering the opening when the camera module is in ON state, and the first display area is adjusted to a second state when the camera module is in OFF state.

Accordingly, the present disclosure also provides a terminal applied to an electronic apparatus comprising: a display panel comprising an opening, a first display area surrounding at least a portion of the opening and a second display area different from the first display area; and a camera module disposed corresponding to the opening to obtain light through the opening. The terminal comprises a memory and one or more programs stored in the memory, and one or more processors are configured to execute the one or more programs including instructions as following: obtaining an ON/OFF state of the camera module and adjusting a working state of the first display area in accordance with the ON/OFF state of the camera module, wherein the first display area is adjusted to a first state so as to shield at least a portion of light from entering the opening when the camera module is in ON state, and the first display area is adjusted to a second state when the camera module is in OFF state.

Figure 12:
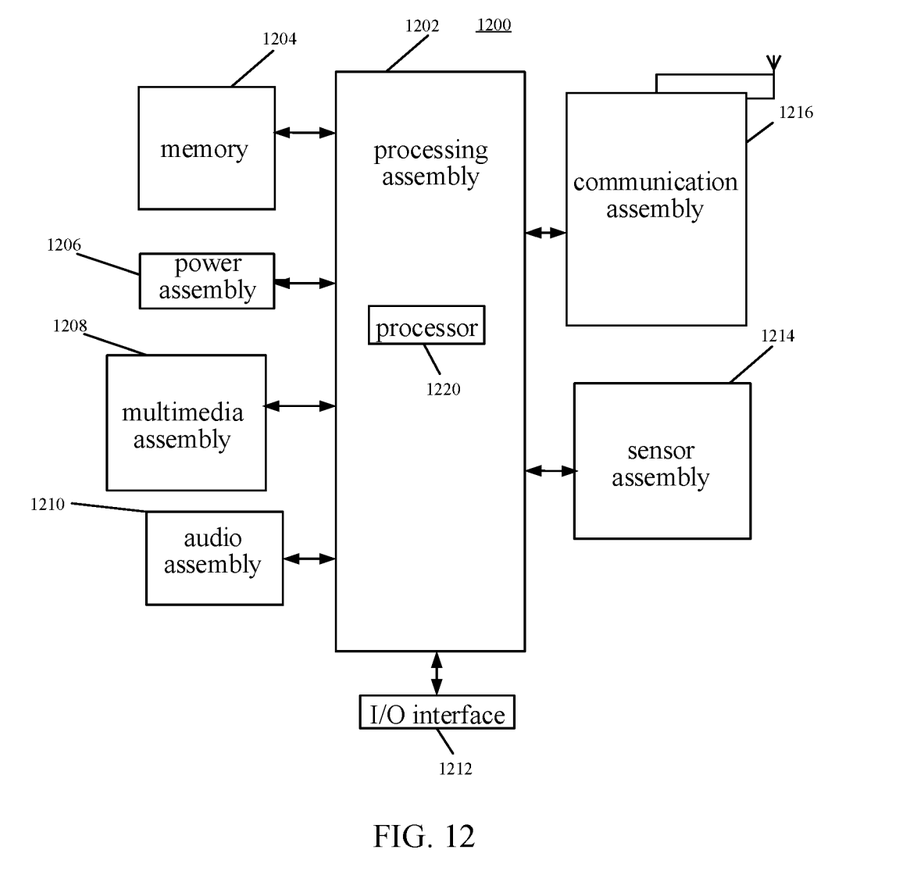
FIG. 12 is a block diagram illustrating a display control device in accordance with a sixth exemplary embodiment.

FIG. 12 is a block diagram illustrating a display control device 1200 in accordance with a sixth exemplary embodiment. For example, device 1200 may be a mobile phone, a computer, a digital broadcasting terminal, a messaging device, a game console, a tablet, a medical device, a fitness apparatus, an exercise equipment, a personal digital assistant, and the like.

Referring to FIG. 12, device 1200 may comprise one or more of the following assemblies: a processing assembly 1202, memory 1204, a power assembly 1206, a multi-media assembly 1208, an audio assembly 1210, an input/output (I/O) interface 1212, a sensor assembly 1214 and a communication assembly 1216.

The processing assembly 1202 typically controls overall operations of the device 800, such as the operations associated with display, telephone calls, data communications, camera operations, and recording operations. The processing assembly 1202 may include one or more processors 1220 to execute instructions to perform all or part of the steps in the above described methods. Moreover, the processing assembly 1202 may include one or more modules which facilitate the interaction between the processing assembly 1202 and other assemblies. For instance, the processing assembly 1202 may include a multimedia module to facilitate the interaction between the multimedia assembly 1208 and the processing assembly 1202.

The memory 1204 is configured to store various types of data to support the operation of the device 1200. Examples of such data include instructions for any applications or methods operated on the device 800, contact data, phonebook data, messages, pictures, video, etc. The memory 1204 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power assembly 1206 provides power to various assemblies of the device 1200. The power assembly 1206 may include a power management system, one or more power sources, and any other assemblies associated with the generation, management, and distribution of power in the device 1200.

The multimedia assembly 1208 includes a screen providing an output interface between the device 1200 and the user. In some embodiments, the screen may include a liquid crystal display (LCD) and a touch panel (TP). In some embodiments, the screen may include an organic light-emitting diode (OLED) display or other types of displays. If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but also sense a period of time and a pressure associated with the touch or swipe action. In some embodiments, the multimedia assembly 1208 includes a front camera and/or a rear camera. The front camera and the rear camera may receive an external multimedia datum while the device 1200 is in an operation mode, such as a photographing mode or a video mode. Each of the front camera and the rear camera may be a fixed optical lens system or have focus and optical zoom capability.

The audio assembly 1210 is configured to output and/or input audio signals. For example, the audio assembly 1210 includes a microphone ("MIC") configured to receive an external audio signal when the device 1200 is in an operation mode, such as a call mode, a recording mode, and a voice recognition mode. The received audio signal may be further stored in the memory 1204 or transmitted via the communication assembly 1216. In some embodiments, the audio assembly 1210 further includes a speaker to output audio signals.

The I/O interface 1212 provides an interface between the processing assembly 1202 and peripheral interface modules, such as a keyboard, a click wheel, buttons, and the like. The buttons may include, but are not limited to, a home button, a volume button, a starting button, and a locking button.

The sensor assembly 1214 includes one or more sensors to provide status assessments of various aspects of the device 1200. For instance, the sensor assembly 1214 may detect an open/closed status of the device 1200, relative positioning of assemblies, e.g., the display and the keypad, of the device 1200, a change in position of the device 1200 or a assembly of the device 1200, a presence or absence of user contact with the device 1200, an orientation or an acceleration/deceleration of the device 1200, and a change in temperature of the device 1200. The sensor assembly 1214 may include a proximity sensor configured to detect the presence of nearby objects without any physical contact. The sensor assembly 1214 may also include a light sensor, such as a CMOS or CCD image sensor, for use in imaging applications. In some embodiments, the sensor assembly 1214 may also include an accelerometer sensor, a gyroscope sensor, a magnetic sensor, a pressure sensor, or a temperature sensor.

The communication assembly 1216 is configured to facilitate communication, wired or wirelessly, between the device 1200 and other devices. The device 1200 can access a wireless network based on a communication standard, such as Wi-Fi, 2G, or 3G, or a combination thereof. In one exemplary embodiment, the communication assembly 1216 receives a broadcast signal or broadcast associated information from an external broadcast management system via a broadcast channel. In one exemplary embodiment, the communication assembly 1216 further includes a near field communication (NFC) module to facilitate short-range communications. For example, the NFC module may be implemented based on a radio frequency identification (RFID) technology, an infrared data association (IrDA) technology, an ultra-wideband (UWB) technology, a Bluetooth (BT) technology, and other technologies.

In exemplary embodiments, the device 1200 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic assemblies, for performing the above described methods.

In exemplary embodiments, there is also provided a non-transitory computer-readable storage medium including instructions, such as included in the memory 1204, executable by the processor 1220 in the device 1200, for performing the above-described methods. For example, the non-transitory computer-readable storage medium may be a ROM, a random-access memory (RAM), a CD-ROM, a magnetic tape, a floppy disc, an optical data storage device, and the like.

Various embodiments of the present disclosure can have one or more of the following advantages.

It can be known from the above embodiments of the present disclosure that the working state of the first display area can be adjusted in accordance with the ON/OFF state of the camera module, so as to decrease the amount of light emitted from the display panel and entering the opening when the camera module is in the ON state, thereby reducing the influence of light emitted from the display panel on the image capturing effect of the camera module and improving the image capturing effect.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable sub combination.

Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

The above description includes part of embodiments of the present disclosure, and not limits the present disclosure. Any modifications, equivalent substitutions, improvements, etc., within the spirit and principles of the present disclosure, are included in the scope of protection of the present disclosure.

It is apparent that those of ordinary skill in the art can make various modifications and variations to the embodiments of the disclosure without departing from the spirit and scope of the disclosure. Thus, it is intended that the present disclosure cover the modifications and the modifications.

Various embodiments in this specification have been described in a progressive manner, where descriptions of some embodiments focus on the differences from other embodiments, and same or similar parts among the different embodiments are sometimes described together in only one embodiment.

It should also be noted that in the present disclosure, relational terms such as first and second, etc., are only used to distinguish one entity or operation from another entity or operation, and do not necessarily require or imply these entities having such an order or sequence. It does not necessarily require or imply that any such actual relationship or order exists between these entities or operations.

Moreover, the terms "include," "including," or any other variations thereof are intended to cover a non-exclusive inclusion within a process, method, article, or apparatus that comprises a list of elements including not only those elements but also those that are not explicitly listed, or other elements that are inherent to such processes, methods, goods, or equipment.

In the case of no more limitation, the element defined by the sentence "includes a . . . " does not exclude the existence of another identical element in the process, the method, or the device including the element.

Specific examples are used herein to describe the principles and implementations of some embodiments. The description is only used to help convey understanding of the possible methods and concepts. Meanwhile, those of ordinary skill in the art can change the specific manners of implementation and application thereof without departing from the spirit of the disclosure. The contents of this specification therefore should not be construed as limiting the disclosure.

For example, in the description of the present disclosure, the terms "some embodiments," or "example," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

In the descriptions, with respect to circuit(s), unit(s), device(s), component(s), etc., in some occurrences singular forms are used, and in some other occurrences plural forms are used in the descriptions of various embodiments. It should be noted; however, the single or plural forms are not limiting but rather are for illustrative purposes. Unless it is expressly stated that a single unit, device, or component etc. is employed, or it is expressly stated that a plurality of units, devices or components, etc. are employed, the circuit(s), unit(s), device(s), component(s), etc. can be singular, or plural.

Based on various embodiments of the present disclosure, the disclosed apparatuses, devices, and methods can be implemented in other manners. For example, the abovementioned devices can employ various methods of use or implementation as disclosed herein.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

Dividing the device into different "regions," "units," "components" or "layers," etc. merely reflect various logical functions according to some embodiments, and actual implementations can have other divisions of "regions," "units," "components" or "layers," etc. realizing similar functions as described above, or without divisions. For example, multiple regions, units, or layers, etc. can be combined or can be integrated into another system. In addition, some features can be omitted, and some steps in the methods can be skipped.

Those of ordinary skill in the art will appreciate that the units, components, regions, or layers, etc. in the devices provided by various embodiments described above can be provided in the one or more devices described above. They can also be located in one or multiple devices that is (are) different from the example embodiments described above or illustrated in the accompanying drawings. For example, the units, regions, or layers, etc. in various embodiments described above can be integrated into one module or divided into several sub-modules.

The various device components, modules, units, blocks, or portions may have modular configurations, or are composed of discrete components, but nonetheless can be referred to as "modules" in general. In other words, the "components," "modules," "blocks," "portions," or "units" referred to herein may or may not be in modular forms.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

The order of the various embodiments described above are only for the purpose of illustration, and do not represent preference of embodiments.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to the disclosed aspects of the exemplary embodiments can be made in addition to those described above by a person of ordinary skill in the art having the benefit of the present disclosure without departing from the spirit and scope of the disclosure contemplated by this disclosure and as defined in the following claims. As such, the scope of this disclosure is to be accorded the broadest reasonable interpretation so as to encompass such modifications and equivalent structures.

The invention claimed is:

1. A display control method, applied to an electronic apparatus comprising: a display panel having an opening, a first display area surrounding at least a portion of the opening, and a second display area different from the first display area; and a camera module disposed corresponding to the opening to obtain light through the opening; the display control method comprising: obtaining an ON/OFF state of the camera module; and adjusting a working state of the first display area in accordance with the ON/OFF state of the camera module, wherein the first display area is adjusted to a first state so as to prevent at least a portion of light emitted by the display panel from entering the opening when the camera module is in ON state, and the first display area is adjusted to a second state when the camera module is in OFF state; wherein the first display area is determined by: obtaining a plurality groups of data of an amount of light entering the opening, each group of which is corresponding to a different size of the first display area; and determining the size of the first display area in accordance with a plurality groups of data of the amount of light and a light leak threshold of the camera module.

2. The display control method according to claim 1, wherein the display panel comprises a liquid crystal display panel, and the adjusting the first display area to the first state comprises:
adjusting deflection angles of liquid crystal molecules corresponding to the first display area in the liquid crystal display panel to shield light emitted from a backlight sheet in the liquid crystal display panel such that the first display area displays black.

3. The display control method according to claim 1, wherein the display panel comprises a self-luminous display panel, and the adjusting the first display area to the first state comprises:
adjusting film transistor units corresponding to the first display area in the self-luminous display panel to an OFF state such that the first display area is switched to a non-display state.

4. The display control method according to claim 1, wherein the adjusting the first display area to the second state when the camera module is in the OFF state, comprises:
adjusting the first display area to a display state when the camera module is in the OFF state.

5. The display control method according to claim 1, wherein the obtaining the ON/OFF state of the camera module comprises:
detecting a preset trigger operation for triggering the camera module and adjusting the ON/OFF state of the camera module; and
determining the ON/OFF state of the camera module in accordance with the preset trigger operation.

6. A non-transitory computer-readable memory medium having stored thereon instructions for execution by a processor to implement the method of claim 1.

7. An electronic apparatus implementing the method of claim 1, comprising:
the display panel;
the camera module;
a processor; and
memory storing instructions for execution by the processor to thereby implement steps of the method.

8. The electronic apparatus of claim 7, wherein the first display area in the first state is configured to reduce influence of the light emitted by the display panel on image capturing effect of the camera module, thereby improving the image capturing effect.

9. The electronic apparatus of claim 8, wherein the display panel comprises a liquid-crystal display (LCD), and the processor is configured to control adjusting deflection angles of liquid crystal molecules corresponding to the first display area in the LCD to shield light emitted from a backlight sheet in the liquid crystal display panel such that the first display area displays black.

10. The electronic apparatus of claim 8, wherein the display panel comprises an organic light-emitting diode (OLED) display, and the processor is configured to control adjusting thin-film transistor (TFT) units corresponding to the first display area in the OLED display to an OFF state such that the first display area is switched to a non-display state.

11. The electronic apparatus of claim 10, wherein the display panel is a touch display panel, and the electronic apparatus is configured to detect a triggering operation from a user touching a "camera" application on the touch display panel, to thereby turn on the camera module and adjusting the first display area to the first state.

12. The electronic apparatus of claim 11, wherein the electronic apparatus is a mobile phone.

13. The electronic apparatus of claim 12, further comprising a multimedia assembly and an audio assembly.

14. A display control device, applied to an electronic apparatus comprising: a display panel comprising an opening, a first display area surrounding at least a portion of the opening and a second display area different from the first display area; and a camera module disposed corresponding to the opening to obtain light by the opening; the display control device comprising: an obtaining module configured to obtain an ON/OFF state of the camera module; and an adjusting module configured to adjust a working state of the first display area in accordance with the ON/OFF state of the camera module, wherein the first display area is adjusted to the first state to prevent at least a portion of light emitted by the display panel from entering the opening when the camera module is in ON state, and the first display area is adjusted to a second state when the camera module is in OFF state; wherein the first display area is determined by: obtaining a plurality groups of data of an amount of light entering the opening, each group of which is corresponding to a different size of the first display area; and determining the size of the first display area in accordance with a plurality groups of data of the amount of light and a light leak threshold of the camera module.

15. The display control device according to claim 14, wherein the display panel comprises a liquid crystal display panel, and the adjusting module comprises:

a first adjusting unit configured to adjust deflection angles of liquid crystal molecules corresponding to the first display area in the liquid crystal display panel to shield light emitted from a backlight sheet in the liquid crystal display panel such that the first display area displays black.

16. The display control device according to claim 14, wherein the display panel comprises a self-luminous display panel, and the adjusting module comprises:

a second adjusting unit configured to adjust a film transistor unit corresponding to the first display area in the self-luminous display panel to an OFF state such that the first display area is switched to a non-display state.

17. The display control device according to claim 14, wherein the adjusting module comprises:

a third adjusting unit configured to adjust the first display area to a display state when the camera module is in the OFF state.

18. The display control device according to claim 14, wherein the obtaining module comprises:

a detecting unit configured to detect a preset trigger operation for triggering the camera module and adjusting the ON/OFF state of the camera module, and to determine the ON/OFF state of the camera module in accordance with preset trigger operation.

* * * * *